United States Patent
Anastasov

(10) Patent No.: US 9,323,654 B2
(45) Date of Patent: Apr. 26, 2016

(54) MEMORY ACCESS USING ADDRESS BIT PERMUTATION

(71) Applicant: Infineon Technologies AG, Neubiberg (DE)

(72) Inventor: Ljudmil Anastasov, Munich (DE)

(73) Assignee: Infineon Technologies AG, Neubiberg (DE)

( * ) Notice: Subject to any disclaimer, the term of this patent is extended or adjusted under 35 U.S.C. 154(b) by 303 days.

(21) Appl. No.: 13/944,254

(22) Filed: Jul. 17, 2013

(65) Prior Publication Data

US 2015/0026420 A1    Jan. 22, 2015

(51) Int. Cl.

| G06F 12/00 | (2006.01) |
| G06F 12/02 | (2006.01) |
| G06F 12/10 | (2006.01) |
| G09G 5/395 | (2006.01) |
| G06F 12/06 | (2006.01) |
| G11C 8/12 | (2006.01) |
| G11C 11/408 | (2006.01) |
| G06F 13/16 | (2006.01) |

(52) U.S. Cl.
CPC .......... G06F 12/0207 (2013.01); G06F 12/10 (2013.01); *G06F 12/0646* (2013.01); *G06F 13/1684* (2013.01); *G09G 5/395* (2013.01); *G09G 2360/123* (2013.01); *G11C 8/12* (2013.01); *G11C 11/4082* (2013.01)

(58) Field of Classification Search
CPC . G06F 12/0207; G06F 12/10; G06F 13/1684; G06F 12/0646; G11C 11/4082; G11C 8/12; G09G 2360/122; G09G 2360/123; G09G 5/395

USPC ................ 711/202, 203, 206, 216, 217, 221
See application file for complete search history.

(56) References Cited

U.S. PATENT DOCUMENTS

| 4,446,530 | A | | 5/1984 | Tsuboka |
| 4,689,823 | A | | 8/1987 | Wojcik et al. |
| 4,727,474 | A | | 2/1988 | Batcher |
| 4,733,187 | A | | 3/1988 | Shimazaki et al. |
| 4,870,491 | A | | 9/1989 | Ishii |
| 4,882,683 | A | | 11/1989 | Rupp et al. |
| 5,095,525 | A | * | 3/1992 | Almgren et al. .............. 711/202 |
| 5,247,632 | A | * | 9/1993 | Newman .......................... 711/1 |
| 5,379,264 | A | * | 1/1995 | Kobayashi et al. ...... 365/230.06 |
| 6,604,166 | B1 | | 8/2003 | Jana et al. |
| 7,170,432 | B2 | | 1/2007 | Ettorre |
| 2002/0184467 | A1 | | 12/2002 | Saen et al. |
| 2003/0001853 | A1 | | 1/2003 | Obayashi |
| 2003/0061461 | A1 | * | 3/2003 | Circello ................. G06F 12/02 711/172 |
| 2007/0240139 | A1 | | 10/2007 | Osada |
| 2007/0247644 | A1 | | 10/2007 | Tsumura |
| 2008/0049719 | A1 | * | 2/2008 | Andreev .......... H03M 13/2764 370/351 |
| 2008/0209159 | A1 | * | 8/2008 | Kim et al. .................... 711/202 |
| 2011/0302333 | A1 | * | 12/2011 | Barry et al. ..................... 710/22 |
| 2012/0250777 | A1 | | 10/2012 | Peron et al. |

FOREIGN PATENT DOCUMENTS

| DE | 31 32 225 | 5/1984 |
| DE | 36 87 218 | 4/1993 |

(Continued)

*Primary Examiner* — Hong Kim
(74) *Attorney, Agent, or Firm* — Schiff Hardin LLP

(57) ABSTRACT

An apparatus including a memory having an array of blocks addressable using address bits; and a permutation circuit coupled to the memory and configured to permutate the address bits such that during a memory access blocks of data are rearranged virtually.

19 Claims, 8 Drawing Sheets

(56) References Cited

FOREIGN PATENT DOCUMENTS

| DE | 38 87 135 | 7/1994 |
| JP | H02-44445 A | 2/1990 |
| JP | H06-295335 A | 10/1994 |
| JP | 2000-231513 A | 8/2000 |
| JP | 2002-312344 A | 10/2002 |
| JP | 2002-366425 A | 12/2002 |
| JP | 2003-084751 A | 3/2003 |

* cited by examiner

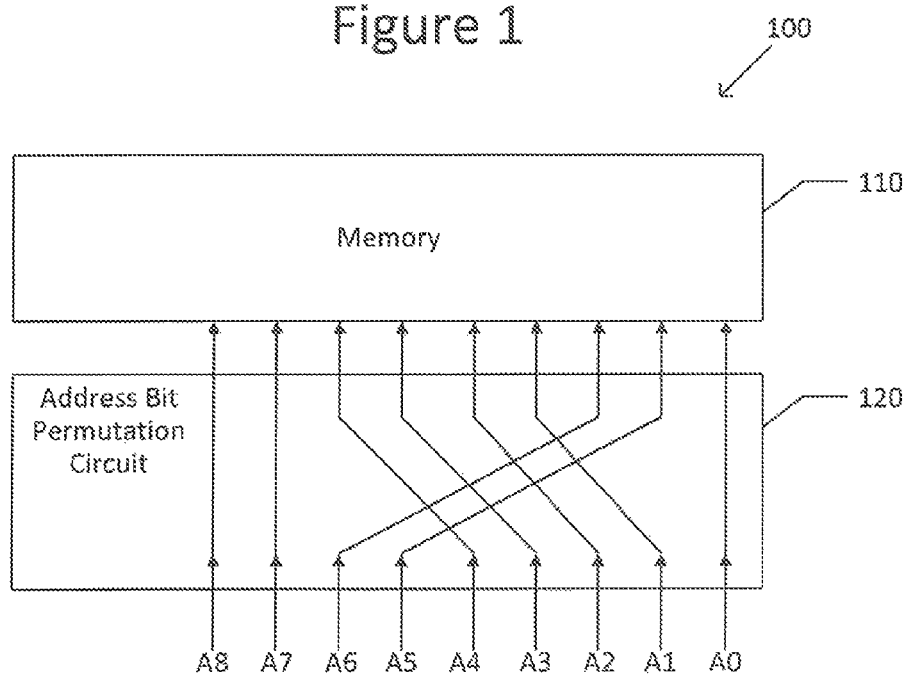
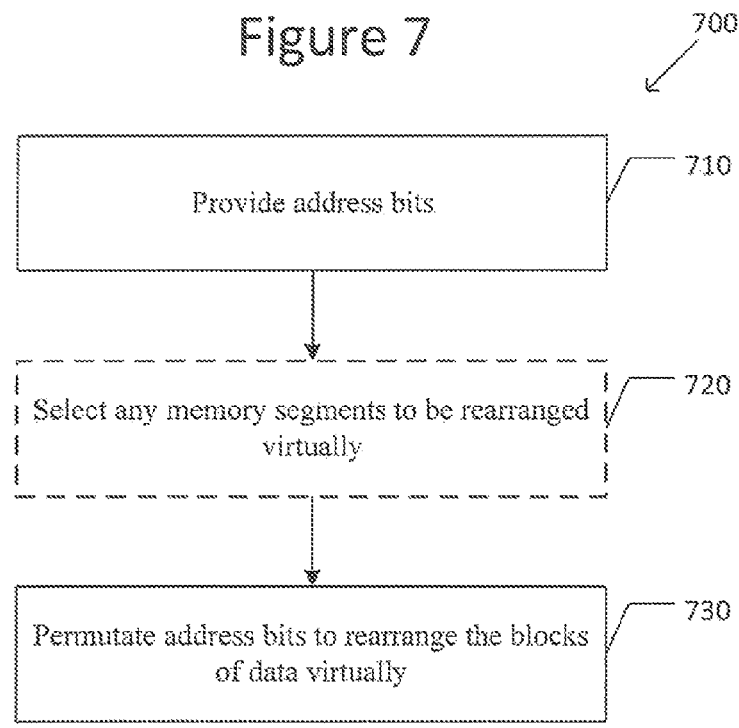

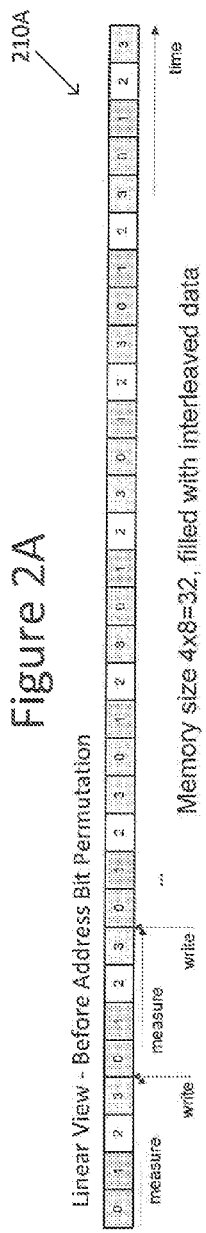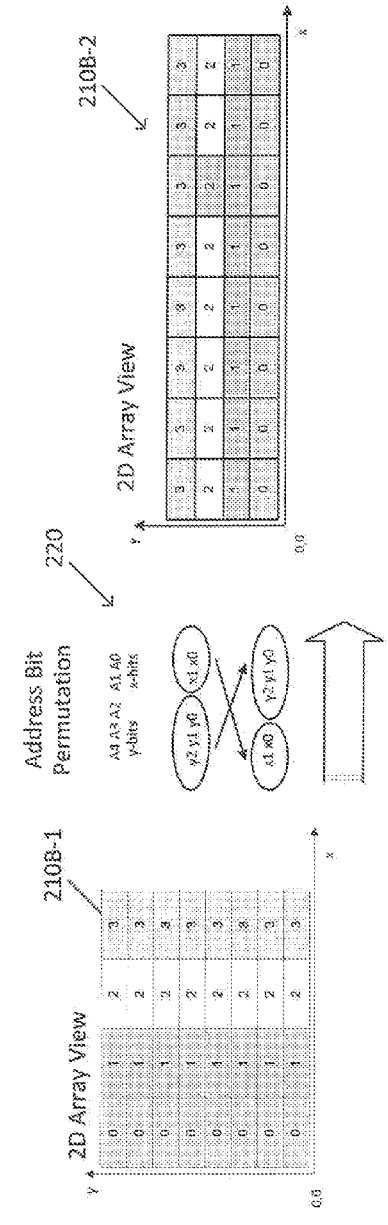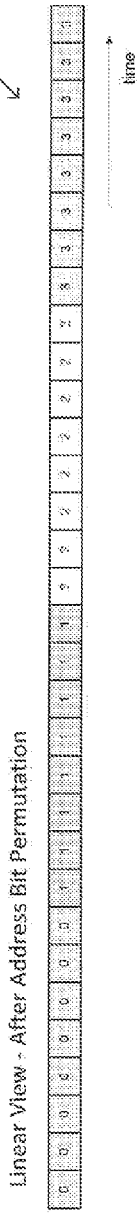
Figure 2A — Linear View - Before Address Bit Permutation. Memory size 4x8=32, filled with interleaved data
Figure 2B — Address Bit Permutation
Figure 2C — Linear View - After Address Bit Permutation

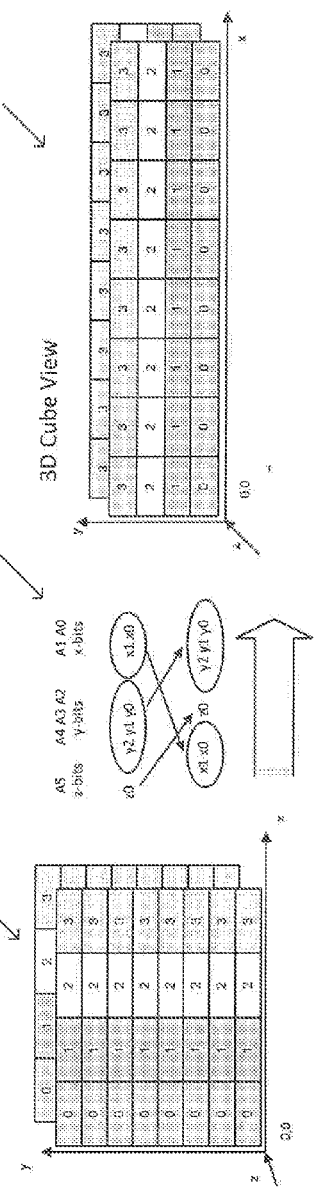

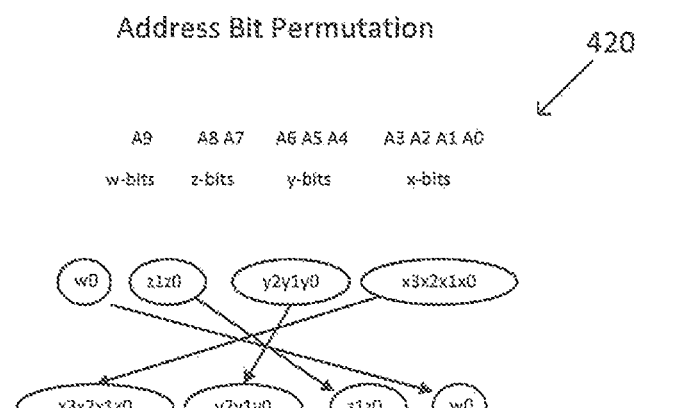

MEMORY ACCESS USING ADDRESS BIT PERMUTATION

BACKGROUND

A memory, such as a random access memory (RAM), is a form of data storage. The memory may have an array of blocks addressable using address bits to access the blocks during a reading or writing operation. A RAM allows data to be accessed in any random order.

In radar applications, by way of example, large amounts of data are written into a memory in an interleaved manner. This data must be de-interleaved before being fed to Fast Fourier Transform (FFT) accelerators, and then the data must be reordered again prior to a second stage of FFT processing. Data is organized in an array of memory blocks in an interleaved manner along its dimensions.

The memory is generally accessed using a direct memory access (DMA) controller having an address counter that jumps a programmable jump width of, for example, 2, 4, or 8 bytes, in the memory address space. This access method is disadvantageous in that it normally does not a permit burst access in which data is transferred in one contiguous sequence. Instead, multiple processing cycles are required to complete a reading or writing operation.

BRIEF DESCRIPTION OF THE DRAWINGS

FIG. 1 illustrates a diagram of a circuit in accordance with an exemplary embodiment.

FIGS. 2A-2C illustrate de-interleaving a two-dimensional memory in accordance with an exemplary embodiment.

FIGS. 3A-3C illustrate de-interleaving a three-dimensional memory in accordance with an exemplary embodiment.

FIG. 4 illustrates of de-interleaving a hypercube-dimensional memory in accordance with an exemplary embodiment.

FIG. 7 illustrates a flowchart for a method of addressing a memory in accordance with an exemplary embodiment.

DETAILED DESCRIPTION

Figure 5A:
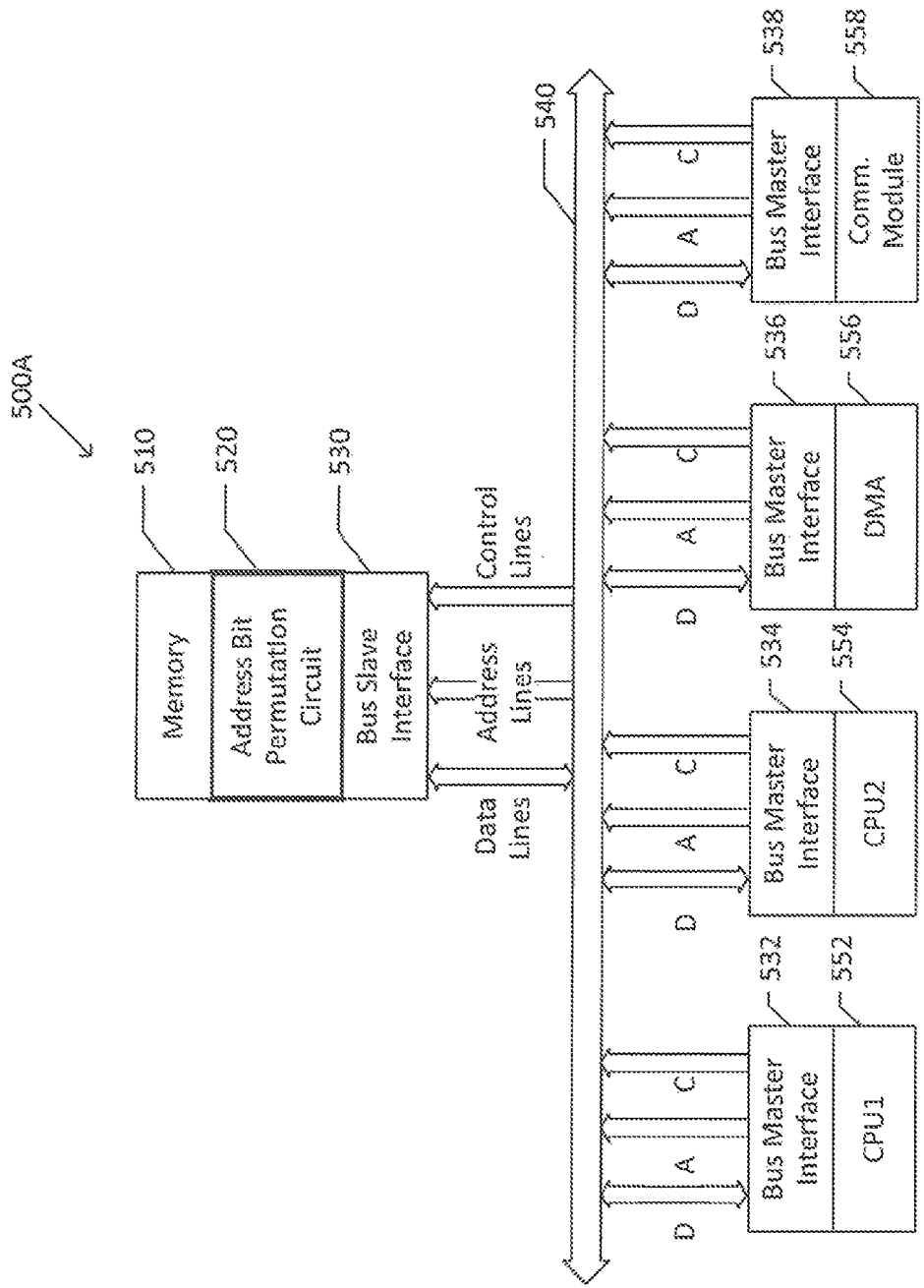
FIG. 5A illustrates a diagram of a circuit in accordance with an exemplary embodiment.

The present disclosure is directed to an apparatus comprising a memory having an array of blocks addressable using address bits, and more specifically, to an apparatus comprising a memory and a permutation circuit that is coupled to the memory and is configured to permutate the address bits such that during a memory access blocks of data are rearranged virtually. By permutating the address bits, data being written/read to/from the memory may be effectively interleaved or de-interleaved. This permutation is configured at the beginning of the memory access and allows standard burst accesses to be used for a data block transfer, which increases the speed of the transfer considerably.

FIG. 1 illustrates a diagram of a circuit 100 in accordance with an exemplary embodiment. More specifically, circuit 100 comprises memory 110 and permutation circuit 120. Memory 110 has an array of blocks (not shown) addressable using address bits A0-A8 to write data to and/or read data from the blocks. The permutation circuit 120 is coupled to the memory 110 and is configured to permutate some of the address bits A1-A6 such that during a memory access blocks of data are rearranged virtually.

A standard memory address is 32-bits wide and may appear as follows: A31 A30 A29 A28 A27 . . . A9 A8 A7 A6 A5 A4 A3 A2 A1 A0.

An address bit permutation operation involves permutating groups of the memory address bits, where a group may be one or more address bits. For example, the groups of address bits of the standard memory address shown above may be permutated by interchanging the group of address bits A6 A5 A4 with the group of address bits A1 A0 as follows: A31 A30 A29 A28 A27 . . . A9 A8 A7 A1 A0 A3 A2 A6 A5 A4 (underlining added for illustration).

Another example is shown in FIG. 1, where the group of address bits A4 A3 A2 A1 is interchanged with the group of address bits A6 A5, so that during access of memory 110, the data is rearranged virtually. As will be explained in more detail below, it is possible to handle data arrays as rectangles, cubes, or hypercubes, configure the size and the position of the "dimensions," and rotate the rectangle/cube/hypercube in an arbitrary manner.

FIGS. 2A-2C illustrate de-interleaving a two-dimensional memory 210 having an array of 4×8 blocks, which is a total of 32 blocks, in accordance with an exemplary embodiment.

FIG. 2A illustrates a linear view of the memory 210A before address bit permutation. The blocks of memory 210A have stored therein data that is interleaved as collected over time. By way of example, memory 210 may store variables measured during a manufacturing operation, 0 being humidity, 1 being temperature, 2 being light, and 3 being pressure. Each of these variables is measured, and then written to memory 210, and then measured again, and then written to memory 210, etc.

FIG. 2B illustrates a two-dimensional view of the address bit permutation operation. By way of overview, memory 210B-1 on the left-hand side of the figure represents a two-dimensional view of memory 210 before address bit permutation, address bit permutation logic circuit 220 represents the address bit permutation operation, and memory 210B-2 on the right-hand side of the figure represents a two-dimensional view of memory 210 after address bit permutation.

Memory 210B-1, which has not been subject to address bit permutation, represents the memory 210 as the data is actually stored, that is in an interleaved manner. Memory 210 is generally written/read across one row at a time, that is, first in the x-axis direction and then in the y-axis direction. More specifically, blocks of row 0 are written/read across (first humidity 0, then temperature 1, then light 2, and then pressure 3), then blocks of row 1 are written/read across (first humidity 0, then temperature 1, then light 2, and then pressure 3), etc. Each writing/reading of a row involves a combination of the different types of data, and thus in this case the data is written/read in an interleaved manner.

Address bit permutation logic circuit 220 permutates the address bits by interchanging x-address bits A1 A0 with y-address bits A4 A3 A2, such that rows x1 x0 are interchanged with columns y2 y1 y0. The result is the data appearing to be organized as illustrated in memory 210B-2.

Memory 210B-2 illustrates how the blocks are organized virtually when memory access occurs after address bit permutation, that is, the blocks appear to be organized in a de-interleaved manner. As mentioned above, memory 210 is generally written/read across one row at a time, that is, first in the x-axis direction and then in the y-axis direction. When memory 210B-2 is read in this manner, blocks of row 0 are read across (humidity blocks 0 only), then blocks of row x1 are read across (temperature blocks 1 only), etc. Data is thus read in a de-interleaved manner such that data blocks of a same type may be read more efficiently in sequence using a burst access method.

A result of the address permutation is that even though the physical memory 210 is actually being read first in the x-axis direction and then in the y-axis direction, the effect is that the order in which the dimensions are read appears to be different. That is, the memory 210 instead appears to be read first in the y-axis direction and then in the x-axis direction.

FIG. 2C illustrates the memory 210C after address permutation, except that rather than being a two-dimensional view as in the case of memory 210B-2, memory 210C is a linear view. As opposed to memory 210A illustrated in FIG. 2A, the blocks shown in memory 210C are de-interleaved. More specifically, rather than blocks of one type being interspersed among other types of blocks, blocks of a same type are accessed as if they are grouped together; humidity blocks 0 are grouped together, temperature blocks 1 are grouped together, light blocks 2 are grouped together, and pressure blocks 3 are grouped together.

FIGS. 3A-3C illustrate de-interleaving a three-dimensional memory 310 having a size of 4×8×2 blocks, which is a total of 64 blocks, in accordance with an exemplary embodiment.

FIG. 3A illustrates a linear view of memory 310A before address bit permutation. The blocks of memory 310A have stored therein data that is interleaved in a manner similar to memory 210A of FIG. 2A. The difference between memory 210A and memory 310A is that memory 310A has an additional dimension, the z dimension. Instead of one page of blocks, memory 310A has two pages of blocks represented by z0 and z1, respectively.

FIG. 3B illustrates a three-dimensional view of the address permutation operation. By way of overview, memory 310B-1 on the left-hand side of the figure represents a three-dimensional view of memory 310 before address permutation, address bit permutation logic circuit 320 represents the address bit permutation operation, and memory 310B-2 on the right-hand side of the figure represents the three-dimensional view of memory 310 after address bit permutation.

Memory 310B-1, which has not been subject to address bit permutation, represents the memory 310 as the data is actually stored, that is in an interleaved manner. Blocks of row 0 are written/read across (first humidity 0, then temperature 1, then light 2, and then pressure 3 blocks), then blocks of row 1 are written/read across (comprising a mix of humidity 0, temperature 1, light 2, and pressure 3 blocks), etc. Each writing/reading of a row results in a combination of different types of data, and thus in this case the data is written/read in an interleaved manner.

Address bit permutation logic circuit 320 permutates the address bits by interchanging groups of address bits as shown in the figure to result in memory 310B-2. The result is the data appearing to be organized as illustrated in memory 310B-2.

Memory 310B-2 illustrates how the blocks are organized virtually when memory access occurs after address bit permutation, that is, the blocks appear to be organized in a de-interleaved manner. Similar to memory 210 of FIG. 2, blocks are read across one row at a time, that is across row x0 of page z0 (comprising humidity blocks 0 only), then across row x1 of page z0 (comprising temperature blocks 1 only), etc. The difference from memory 210B-2 of FIG. 2B though, is that after page z0 is read, page z1 is subsequently read in a similar manner. Data is read in a de-interleaved manner such that data blocks of a same type may be read more efficiently in sequence using a burst access method.

A result of the address bit permutation is that even though the physical memory 310 is actually being read first in the x-axis direction, then in the y-axis direction, and then in the z-axis direction, the effect is that the order in which the dimensions are read appears to be different. The memory 310 appears to be read first in the y-axis direction, then the z-axis direction, and then the x-axis direction.

FIG. 3C illustrates the memory 310C after address permutation as in the case of memory 310B-2, except that rather than being a three-dimensional view, memory 310C is a linear view. As opposed to memory 310A illustrated in FIG. 3A, the blocks as illustrated memory 310C are de-interleaved. More specifically, humidity blocks 0 are grouped together, temperature blocks are grouped together, light blocks are groups together, and pressure blocks 3 are groups together.

FIG. 4 illustrates de-interleaving a hypercube memory (not shown) having greater than three dimensions, in accordance with an exemplary embodiment. In this exemplary embodiment, the memory has four dimensions with a size of 16×8×4×2 blocks, which is a total of 1024 blocks. Address bit permutation logic circuit 420 representing the address bit permutation operation is shown. The memory is not shown due to the difficulty in illustrating on paper an array of blocks having greater than three dimensions.

Address bit permutation logic circuit 420 permutates the address bits by interchanging groups of address bits as shown. After reading the foregoing descriptions of the two-dimensional example shown in FIGS. 2A-2C and the three-dimensional example shown in FIGS. 3A-3C, those skilled in the art appreciate the details of this four-dimensional example. Address bit permutation logic circuit 420 will therefore not be discussed in more detail here for the sake of brevity and to not unnecessarily obscure aspects of the disclosure.

It is optimal if the memory is sized such that its array has $2^N$ number of blocks, where N is a number of the respective dimension. For example the four-dimensional array described above has a size of 16×8×4×2 blocks, that is $2^4 \times 2^3 \times 2^2 \times 2^1$, where 4 is the number of the fourth dimension, three the number of the third dimension, etc. It is possible for one or more dimensions of an array of blocks to have a size other than $2^N$, but additional considerations may be necessary.

FIG. 5A illustrates a diagram of circuit 500A in accordance with an exemplary embodiment. More specifically, circuit 500A shows address bit permutation circuit 520 coupled directly to memory 510. CPU1 552, CPU 554, DMA 556 and communication module 558 share access to memory 510, with only one of these devices being granted access at any one time. Access is carried out through the bus system comprised of bus master interfaces 532, 534, 536, 538, bus master 540, and bus slave interface 530. The bus system includes data lines, address lines, and control lines. Each of CPU1 552, CPU 554, DMA 556 and communication module 558 has its own bus master interface 532, 534, 536, 538, respectively, to transmit to bus slave interface 530 control signals C and address bits A identifying in memory 510 specific blocks to be accessed. In this exemplary embodiment, bus master interfaces 532, 534, 536, 538 drive the address lines. Data D may be transmitted through the bus system in both directions between each of the devices (CPU1 552, CPU2 554, DMA 556, and communication module 558) and memory 510, with data D being written/read to/from specific memory blocks identified by address bits A.

Figure 5B:
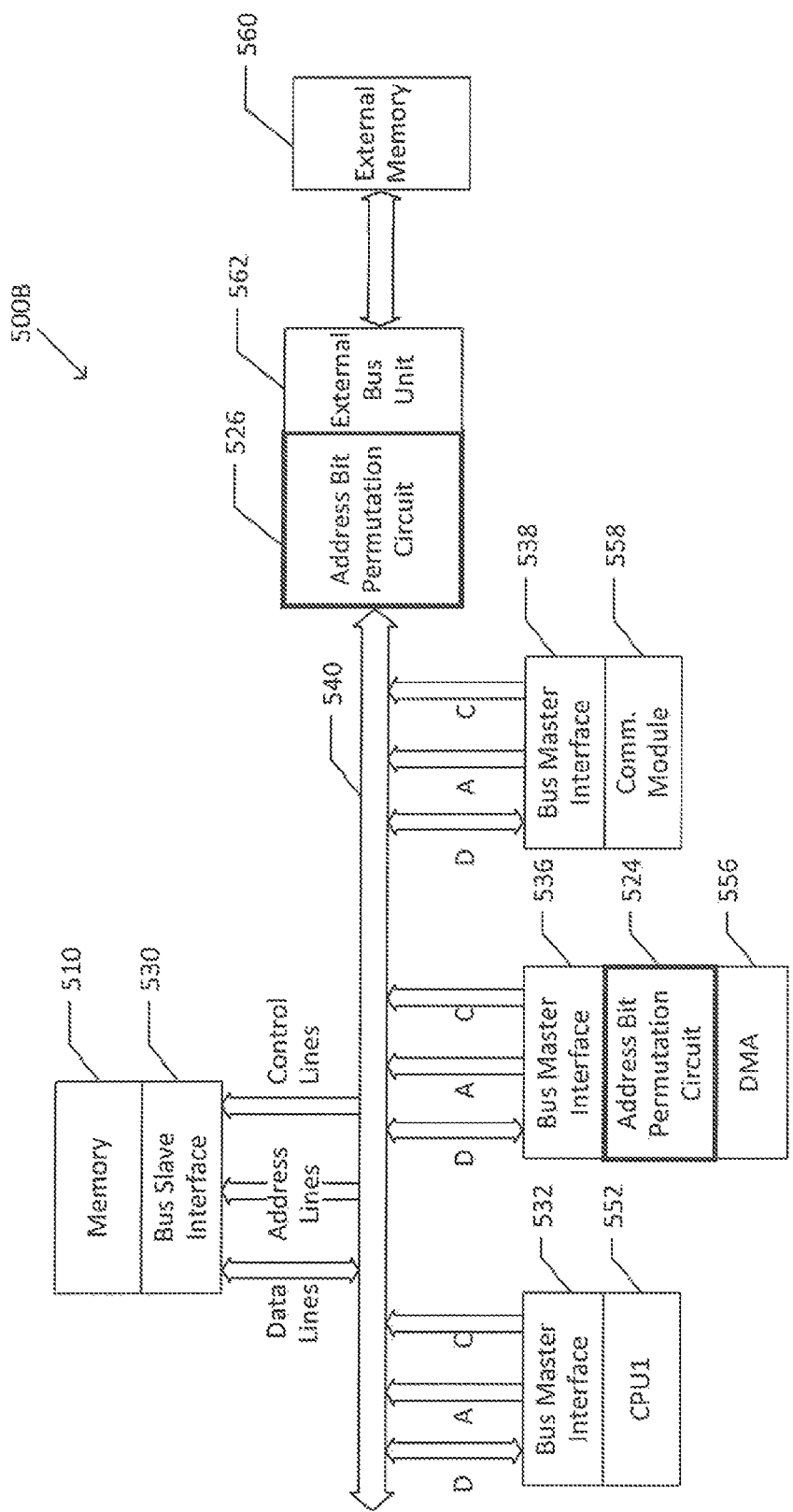
FIG. 5B illustrates a diagram of a circuit in accordance with an alternative exemplary embodiment.

FIG. 5B illustrates a diagram of circuit 500B in accordance with an alternative exemplary embodiment. More specifically, circuit 500B shows alterative locations for an address bit permutation circuit as compared with its location in FIG. 5A. Address bit permutation circuit 524 is coupled directly to DMA 556 so that DMA 556 can permutate its own address bits. Alternatively, address bit permutation circuit 524 may be located within DMA 556. Another address bit permutation circuit 526 is coupled to an external memory 560 by way of an external bus unit 562 off-chip from address bit permutation circuit 526.

While the address bit permutation circuit has been described as being at particular locations or in particular quantities in circuit 500A and 500B, the disclosure is not meant to be limited in these respects. The address bit permutation circuit may be at any suitable location and in any suitable quantity.

Figure 6A:
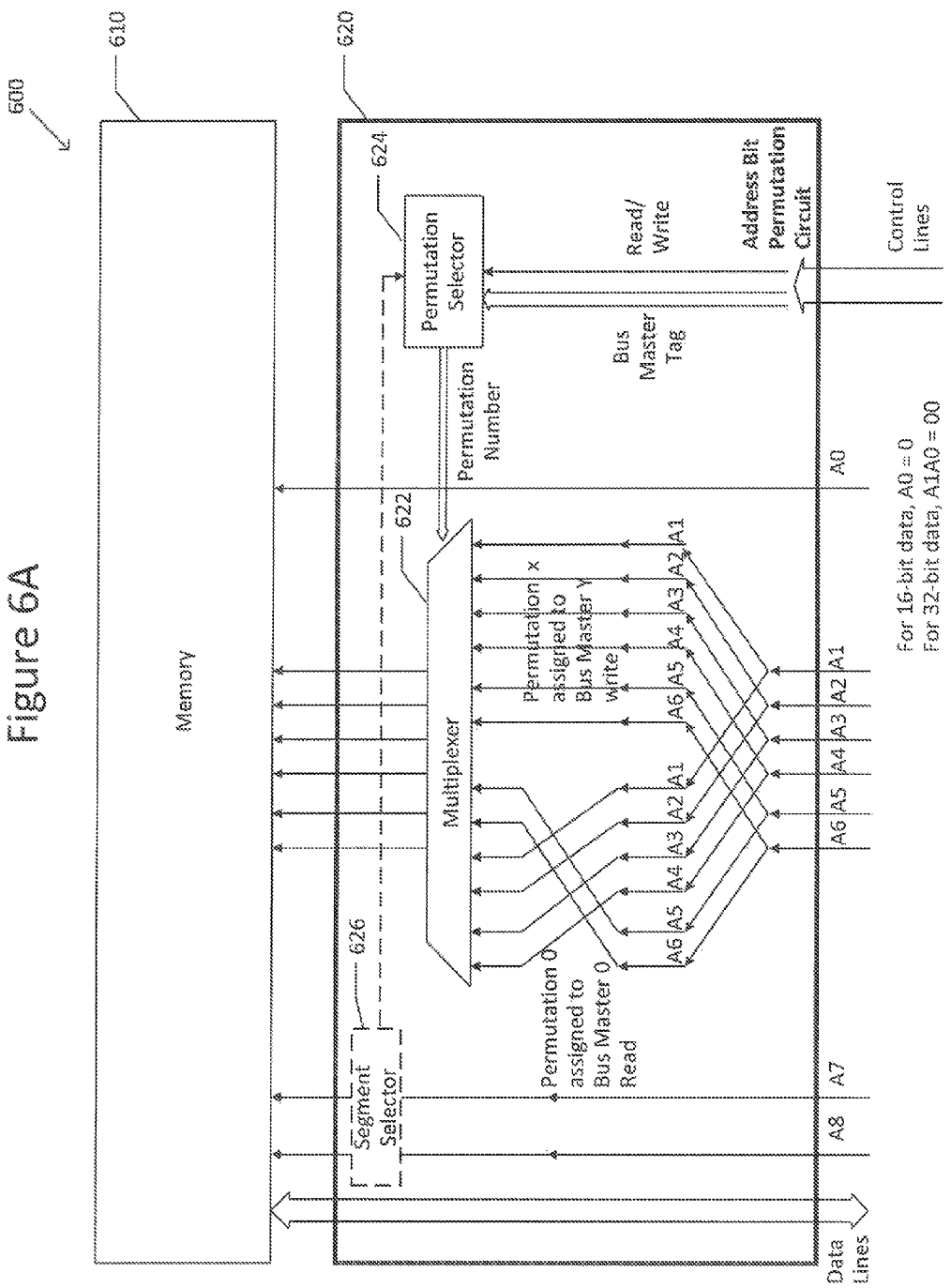
FIG. 6A illustrates a diagram of a circuit in accordance with an exemplary embodiment.

FIG. 6A illustrates a diagram of a circuit 600 in accordance with an exemplary embodiment. More specifically, circuit 600 comprises memory 610 and address bit permutation circuit 620. As discussed above with respect to FIGS. 5A and 5B, memory 610 coupled with the rest of circuit 600 by data lines, control lines, and address lines. The number of address lines shown is nine, and the number of bus masters shown is two, but the disclosure is not limited in either of these respects.

Address bit permutation circuit 620 comprises multiplexer 622, permutation selector 624, and an optional segment selector 626 (described below with respect to FIG. 6B). Multiplexor 622 receives from address lines address bits A6 A5 A4 A3 A2 A1 identifying the blocks to/from which data should be written/read. Permutation selector 624 is configured to control multiplexer 622 using a permutation number, which identifies a particular permutation, bus master, and read/write operation based on control information it receives over control lines. Any combination of permutation, bus master, and read/write operation is possible.

Only one of the bus masters during a memory access is selected to enable a device coupled thereto to address memory 610. In this particular exemplary embodiment, multiplexer 622 selects between permutation x assigned to bus master y, and permutation 0 assigned to bus master 0. As discussed above, data may be written in one order and read in a different order. More specifically, data may be first written to memory 610 in an interleaved manner using bus master y with the address bits being un-permutated, and then read from memory using bus master 0 in a de-interleaved manner by permutating the address bits.

The address bit permutation circuit 620 is configured to rearrange virtually blocks of data identified by an address having a size $2^N$ bytes, wherein N represents a number of least significant bits of the address bits not being subject to permutation. Referring to FIG. 6, A0 is not subject to permutation, and thus the size of each of the data blocks is $2^1$ bytes, or 16 bits, one byte being 8 bits. If A1 and A0 were not subject to permutation, then the size of each of the data blocks would be $2^2$ bytes, or 32 bits. The data block sizes may therefore be 8 bits, 16 bits, 32 bits, 64 bits, etc.

Figure 6B:
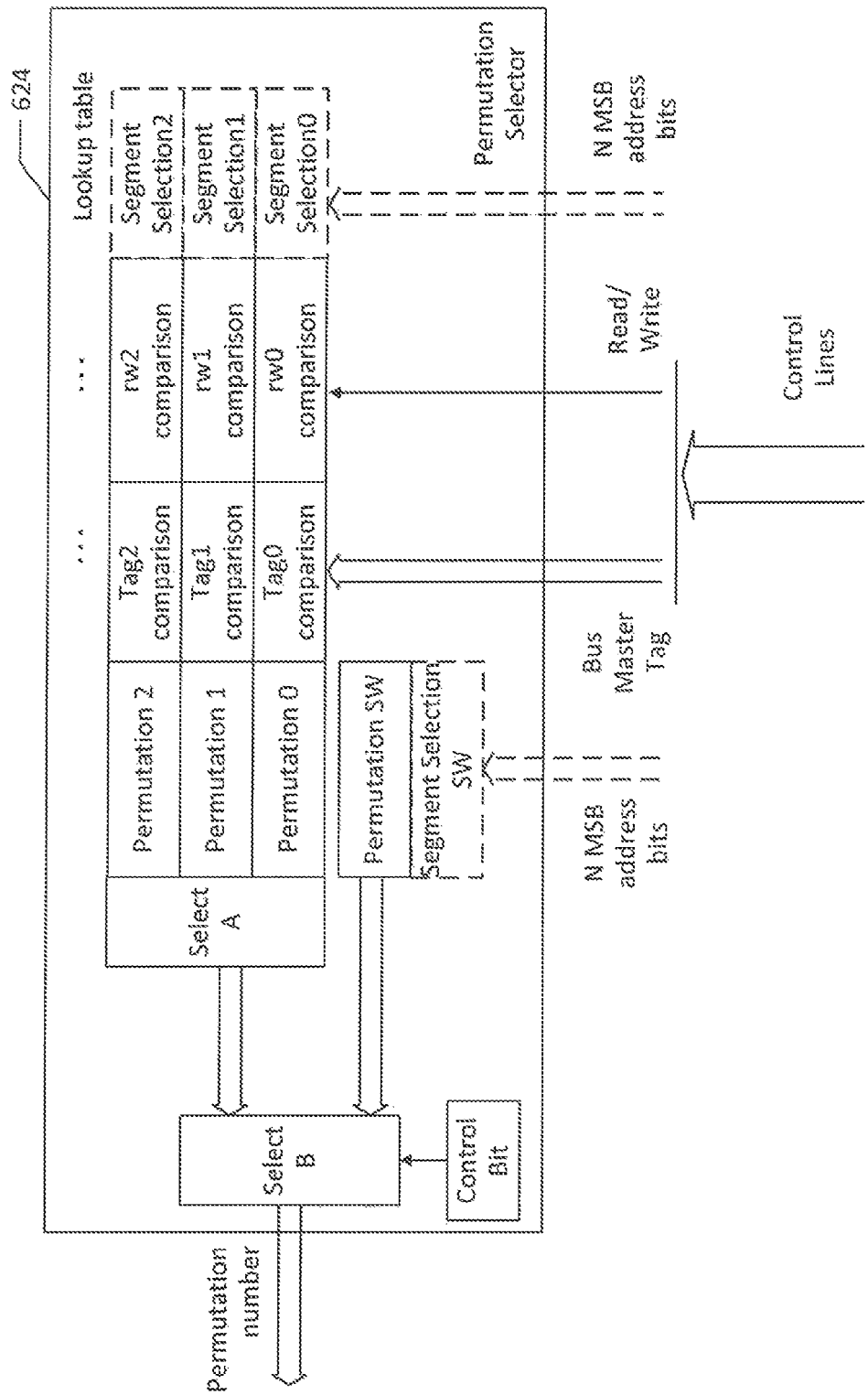
FIG. 6B illustrates a block diagram of the permutation selector of FIG. 6A in accordance with an exemplary embodiment.

FIG. 6B illustrates a block diagram of the permutation selector 624 of FIG. 6A in accordance with an exemplary embodiment. Permutation selector 624 may select a particular permutation and output a corresponding permutation number in a manner that is either dynamic or static manner.

During dynamic selection, a permutation selection is made for each memory access. Selection Unit B selects information from Selection Unit A; Selection Unit A selects a particular permutation, bus master, and read/write operation from lookup table in accordance with bus master tag and read/write control information received over control lines. There are many ways to organize permutation options in the lookup table, and thus the disclosure is not intended to be limited to the particular table shown in FIG. 6B.

Alternatively, during static selection, the same permutation selection is not made for each memory access but instead remains the same. Permutation selector 624 selects a permutation statically via software using a static control bit(s). In this case Selection Unit B selects SW permutation, in which case Selection Unit A for the bus master tag, read/write control information, and lookup table is ignored.

The permutation selection number setting is generally mirrored for all memory blocks throughout memory 610 because the addresses repeat themselves. This mirroring effect is not always desired. It may be that in some cases address bits should be permutated for only particular segments of the memory, a segment being defined as one or more memory blocks. A segment selector 626 (shown in FIG. 6A) therefore optionally selects any segments to be subjected to address bit permutation during memory access, and the remaining segments are accessed in their default order. This segment selection is made using the N most significant bits (MSB), such as A7 and A8 shown in FIG. 6A.

FIG. 7 illustrates a flowchart for a method of addressing a memory having an array of blocks addressable using address bits in accordance with an exemplary embodiment.

Initially, in step 710, address bits are provided.

At step 730, the address bits are permutated such that during a memory access blocks of data are rearranged virtually.

Optionally, at step 720, any memory segments to be rearranged virtually are selected such that less than all of the blocks of data are rearranged. As discussed above with respect to FIG. 6B, this selection feature prevents permutation from being mirrored for all memory blocks throughout the memory.

Data interleaving/de-interleaving is used in many applications. Examples include radar applications, where perhaps eight ADCs are read in a round-robin fashion. The data from each of the ADCs is interleaved (e.g., 12345678 12345678 12345678 12345678) and must be de-interleaved (e.g., 1111 2222 3333 4444 5555 6666 7777 8888) before FFT processing. Data must then be reordered again before a second FFT processing. Data reordering is accomplished by permutating the address bits of the memory. Reordering data in this manner avoids address jumps and increments, which requires multiple processing cycles. The memory can therefore be more efficiently copied for feeding to FFT accelerators using DMA with burst access.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present application. This application is intended to cover any adaptations or variations of the specific embodiments discussed herein.

What is claimed is:

1. An apparatus, comprising:
a memory having an array of blocks addressable using address bits; and
a permutation circuit coupled to the memory and configured to permutate the address bits such that during a memory access blocks of data are rearranged virtually, wherein the permutation circuit comprises:
a permutation selector configured to select a permutation; and
a multiplexor configured to select based on the selected permutation one of a plurality of bus masters, wherein only one of the plurality of bus masters is selected to enable a device coupled to the selected bus master to access the memory.

2. The apparatus of claim 1, wherein the array of blocks is a one-dimensional array of blocks.

3. The apparatus of claim 1, wherein the array of blocks is a two-dimensional array of blocks.

4. The apparatus of claim 3, wherein the permutation circuit is configured to permutate the address bits by interchanging row address bits with column address bits.

5. The apparatus of claim 1, wherein the array of blocks is a three-dimensional array of blocks.

6. The apparatus of claim 5, wherein the permutation circuit is configured to permutate the address bits by interchanging address bits of at least two of the three dimensions.

7. The apparatus of claim 1, wherein the array of blocks is a hypercube array of blocks having greater than three dimensions.

8. The apparatus of claim 1, wherein each dimension of the array of blocks has $2^N$ number of blocks, where N is a number of the respective dimension.

9. The apparatus of claim 1, wherein selection of a first of the plurality of bus masters results in the address bits being permutated, and selection of a second of the plurality of bus masters results in the address bits remaining unpermutated.

10. The apparatus of claim 9, wherein the selection of the first of the plurality of bus masters results in data being written or read, and the selection of the second of the plurality of bus masters results in data being the other of written or read.

11. The apparatus of claim 1, wherein the permutation circuit comprises a segment selector configured to select any segments of the memory to be rearranged virtually such that less than all of the blocks of data are rearranged.

12. The apparatus of claim 1, wherein the permutation circuit is configured to rearrange virtually blocks having a size of $2^N$ bytes, where N represents a number of least significant bits of the address bits not being subject to permutation.

13. The apparatus of claim 1, wherein the permutation circuit comprises a lookup table of permutation options.

14. The apparatus of claim 1, wherein the permutation circuit is located on a chip, and the memory is an external memory located off-chip.

15. A method of accessing a memory having an array of blocks addressable using address bits, the method comprising:
providing the address bits; and
permutating the address bits such that during a memory access blocks of data are rearranged virtually, wherein the permutating comprises:
selecting a permutation; and
selecting based on the selected permutation one of a plurality of bus masters, wherein only one of the plurality of bus masters is selected to enable a device coupled to the selected bus master to access the memory.

16. The method of claim 15, wherein the array of blocks is a two-dimensional array of blocks, and the permutating step comprises interchanging row address bits with column address bits.

17. The method of claim, 16, wherein the array of blocks is a three-dimensional array of blocks, and the permutating step comprises interchanging address bits of at least two of the three dimensions.

18. The method of claim 16, further comprising selecting any segments of the memory to be rearranged virtually such that less than all of the blocks of data are rearranged.

19. An apparatus, comprising:
a memory having an array of blocks addressable using address bits; and
a permutation means for permutating the address bits such that during a memory access blocks of data are rearranged virtually, wherein the permutation means comprises:
a permutation selecting means for selecting a permutation; and
a multiplexing means for selecting based on the selected permutation one of a plurality of bus masters, wherein only one of the plurality of bus masters is selected to enable a device coupled to the selected bus master to access the memory.

* * * * *